United States Patent [19]

Fujii et al.

[11] Patent Number: 4,551,840
[45] Date of Patent: Nov. 5, 1985

[54] DIGITAL DATA DUPLICATION APPARATUS

[75] Inventors: Yasuhiko Fujii, Yamato; Isao Owaki, Tokyo; Susumu Saito; Takaro Mori, both of Sagamihara; Shinji Nakamura, Tokyo, all of Japan

[73] Assignee: Victor Company of Japan, Limited, Yokohama, Japan

[21] Appl. No.: 452,971

[22] Filed: Dec. 27, 1982

[30] Foreign Application Priority Data

Dec. 29, 1981 [JP] Japan .................................. 56-215893

[51] Int. Cl.⁴ ............................................. G06F 11/10
[52] U.S. Cl. ........................................ 371/38; 360/15; 360/48; 360/53
[58] Field of Search ................... 360/53, 13, 15, 48; 371/38

[56] References Cited

U.S. PATENT DOCUMENTS

| | | | |
|---|---|---|---|
| 3,774,154 | 11/1973 | Devore et al. | 371/38 |
| 3,805,284 | 4/1974 | Coon, Jr. et al. | 360/15 |
| 3,875,588 | 4/1975 | Bennett | 360/15 |
| 3,922,669 | 11/1975 | Baldwin | 340/347 DD |
| 4,052,698 | 10/1977 | Ragle | 371/78 |
| 4,211,997 | 7/1980 | Rudnick | 371/38 |
| 4,277,844 | 7/1981 | Hancock et al. | 371/78 |
| 4,281,355 | 7/1981 | Wada et al. | 360/32 |
| 4,292,684 | 11/1981 | Kelly et al. | 360/53 X |
| 4,410,917 | 10/1983 | Newdoll et al. | 360/15 |
| 4,423,441 | 12/1983 | Ozaki et al. | 360/13 |

FOREIGN PATENT DOCUMENTS 1491671 1/1967 France .

OTHER PUBLICATIONS

Reynolds Marchant; Duplicating Jul. 1949, Electronics, pp. 72-75.
IEEE Spectrum-Oct. 1977-Marvin Camras State of the Audio Tape Art, pp. 528-535.

Primary Examiner—Raymond F. Cardillo, Jr.
Assistant Examiner—Alyssa H. Bowler
Attorney, Agent, or Firm—Jordan and Hamburg

[57] ABSTRACT

A data recording and reproducing apparatus promotes error-free and speedy exchange of data between separate recording media. When desired primary data is to be recorded on a master recording medium, secondary data is added to the primary data in order to detect and correct data errors. The primary and secondary data are recorded on the master recording medium in a plurality of series which differ in recording sequence from each other. The primary data is reproduced from the master recording medium together with the secondary data for the different series at the same time, regardless of their recording sequences. The reproduced primary data is allowed for error check and correction based on the secondary data and is recorded in the slave recording medium.

5 Claims, 24 Drawing Figures

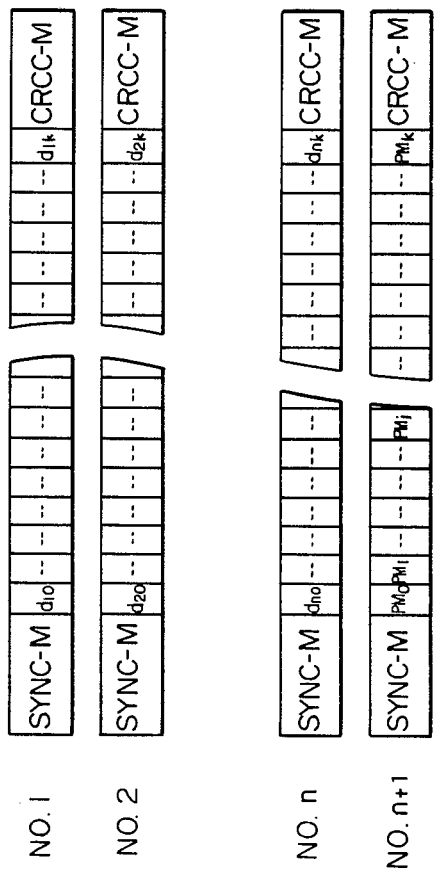

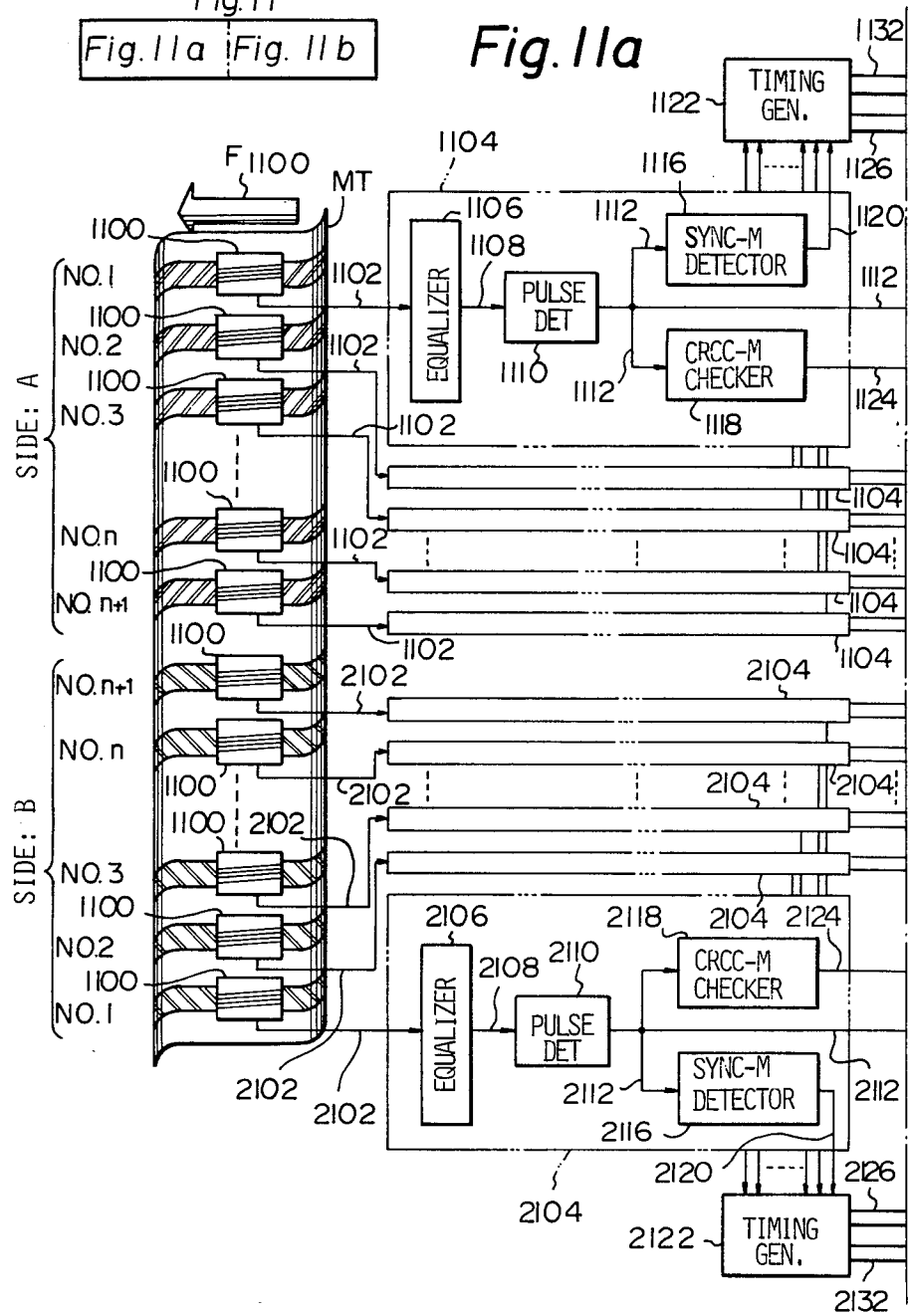

1

DIGITAL DATA DUPLICATION APPARATUS

BACKGROUND OF THE INVENTION

The present invention relates to an apparatus for recording data in a recording medium and an apparatus for reproducing data recorded in a recording medium (referred to simply as "data recording and reproducing apparatus" hereinafter). More particularly, the present invention is concerned with an improvement in a system for writing data in a magnetic tape, magnetic disc or like recording medium by use of digital signals and a system for reading data so recorded in such a recording medium.

Recently, computers and like data processing devices have been extensively used in various fileds. And there is an increasing demand for quickly transferring recorded information processed by the devices from one media to another such as magnetic discs or tapes for wide distribution of the same information content.

A current trend in the art of audio equipment in particular, is to the digital processing of various data and this demands the supply of magnetic tapes which store the same pieces of music or the like in digital signals. Again, the same content has to be transferred into multiple number of magnetic tapes in a short period of time. A method heretofore known for recording the same data on magnetic tapes is to prepare a master tape by recording the data on it and then dub the master tape to produce a slave tape, as has been the most typical procedure in the traditional data processing with analog signals. This method, however, cannot be readily applied to magnetic tapes which store data in digital signals. Because magnetic tapes (particularly master tape) often have scratches or gather fine particles of dust or even suffer from stains during handling, the data may be partly dropped out to render the accurate and quick transfer of the whole data from the master tape to the slave tape difficult.

SUMMARY OF THE INVENTION

A data recording and reproducing apparatus embodying the present invention reproduces primary data stored in a master recording medium as a plurality of series of different recording sequences and records the reproduced primary data on a slave recording medium. A first device of the apparatus suitably divides the primary data of each series when the primary data is to be recorded on the recording medium, adds secondary data to the primary data employing each fragment of the primary data as a unit, and records the primary and secondary data on the master recording medium. A second device reproduces the primary data from the master recording medium together with the secondary data for the plurality of series at the same time, regardless of which the recording order of the series to which the primary data belongs, detects and corrects an error in the primary data which is reproduced based on the reproduced secondary data, and records the primary data on the slave recording medium.

In accordance with the present invention, a data recording and reproducing apparatus promotes error-free and speedy exchange of data between separate recording media. When desired primary data is to be recorded on a master recording medium, secondary data is added to the primary data in order to detect and correct data errors. The primary and secondary data are recorded on the master recording medium in a plurality of series data which differ in recording sequence from each other. The primary data is reproduced from the master recording medium together with the secondary data for the different series at the same time, regardless of their recording sequences. The reproduced primary data is allowed for error check and correction based on the secondary data and is recorded on the slave recording medium.

It is an object of the present invention to promote accurate and prompt reading of data by providing means for easily detecting any error during data readout from a master recording medium and correcting the error.

It is another object of the present invention to effect quick writing of data in a slave recording medium by writing data in a master recording medium by a procedure which is not always identical with a procedure for reading data therefrom.

It is another object of the present invention to minimize errors in data stored in a slave recording medium, thereby improving the quality of data reproduction.

It is another object of the present invention to provide a generally improved data recording and reproducing apparatus.

Other objects, together with the foregoing, are attained in the embodiments described in the following description and illustrated in the accompanying drawings.

BRIEF DESCRIPTION OF THE DRAWINGS

FIG. 9 is a view of an exemplary data arrangement of one master frame which is recorded on a master tape;

FIG. 11a and 11b are block diagrams showing details of a data reproduction device associated with a master tape;

DESCRIPTION OF THE PREFERRED EMBODIMENTS

While the data recording and reproducing apparatus of the present invention is susceptible of numerous physical embodiments, depending upon the environment and requirements of use, substantial numbers of the herein shown and described embodiments have been made, tested and used, and all have performed in an eminently satisfactory manner.

Figure 1A:
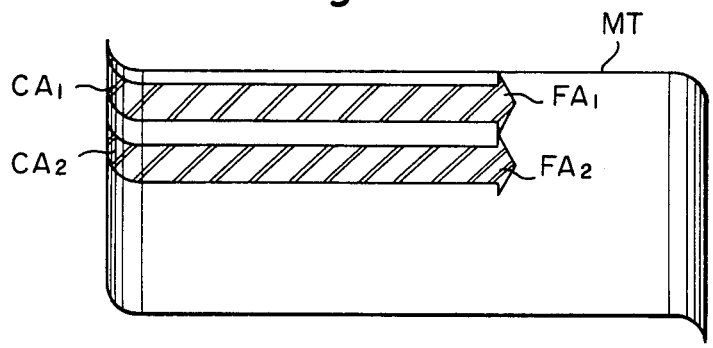
FIGS. 1a-1c are views of a magnetic tape representing a procedure for recording data in analog signals therein.

To facilitate understanding of the present invention, a brief reference will be made to a prior art dubbing system, depicted in FIGS. 1a–1c. Music or like data is recorded on a master tape in the illustrated manner. In FIG. 1a, a master tape MT has a first recording surface or side "A" as will be called hereinafter, which has two channels $CA_1$ and $CA_2$ in the illustrated example. Analog signals are progressively recorded in the channels $CA_1$ and $CA_2$ in the directions indicated by arrows $FA_1$ and $FA_2$, respectively. Thus, the upper half of the master tape MT is used for recording data in the side A. It will be noted that the number of channels is more than two in some applications.

Figure 1B:
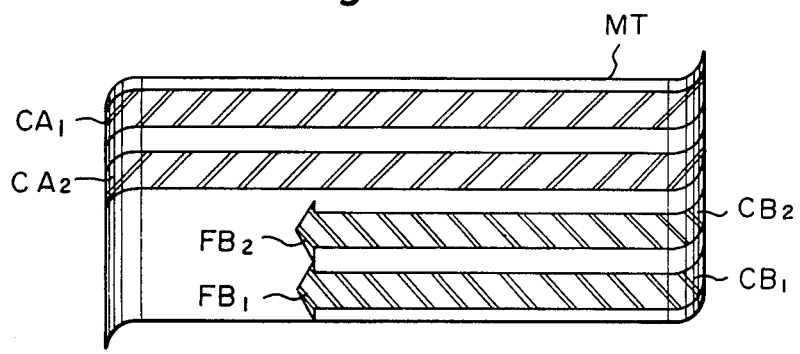

As shown in FIG. 1b, analog signals are recorded on a second recording surface or side "B" in the directions indicated by arrows $FB_1$ and $FB_2$. While in practice data recording on the side B is performed with the master tape inverted in position relative to a recording apparatus, the recording directions may be indicated as shown in FIG. 1b with respect to the recording directions and positions on the side A. Thus, the directions $FB_1$ and $FB_2$ in channels $CB_1$ and $CB_2$ on the side B are opposite to the directions $FA_1$ and $FA_2$ on the side A.

Figure 1C:
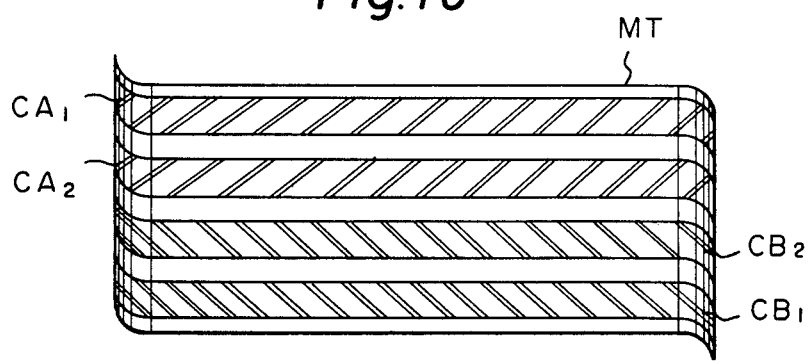

The master tape MT carrying the data all over the A and B sides is illustrated in FIG. 1c. The data is reproduced simultaneously from all the channels $CA_1$, $CA_2$, $CB_1$ and $CB_2$ of the master tape MT and recorded on a slave tape. Of the A and B sides of the master tape MT, one is reproduced in the same direction as the recording direction while the other is reproduced in the opposite direction to the recording direction.

Such dubbing of a master tape to prepare a slave tape is, in principle, applicable to a master tape which has stored data in digital signals. However, in the case of digital signals, particularly PCM (pulse code modulation) signals, burst errors tend to occur due to the dropout caused by scratches or the like on the master tape MT. This will be reflected by a objectionable level of noise during reproduction of data from a slave tape. To insure the quality of slave tapes, a sufficient measure has to be taken against all the factors which make the data transfer erratic.

In light of this, the present invention is elaborated to make the data reproduction high quality despite any dropout or the like and enable data to be recorded at a high speed from a master tape to a slave tape by a procedure similar to the analog signal dubbing system.

Figure 2:
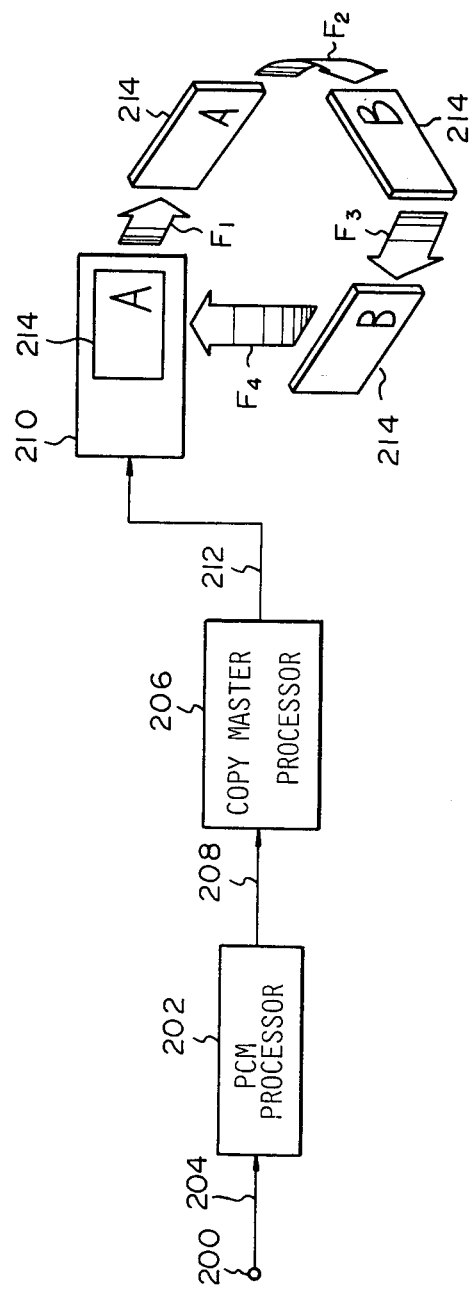
FIG. 2 is a block diagram showing a device for recording data on a master tape cassette in accordance with the present invention.
Figure 3A:
FIGS. 3a-3c are diagrams showing signals which appear in various sections of the device shown in FIG. 2.
Figure 3B:
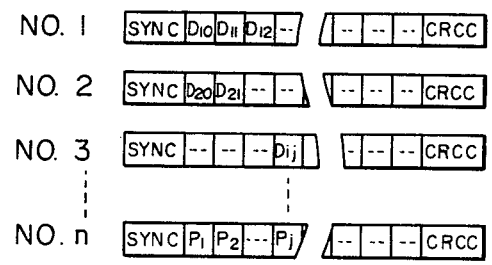

Referring to FIGS. 2 and 3a–3c, a device for recording data in a master tape in accordance with the present invention will be outlined. As shown, an input terminal 200 is connected to a PCM processor 202 by a line 204 and supplied with an analog signal to be recorded from the outside, such as one shown in FIG. 3a. The PCM processor 202 samples, holds, quantizes and encodes the input analog signal, delivering parallel signals as shown in FIG. 3b. The parallel signals shown in FIG. 3b are given by dividing the analog signal of FIG. 3a into suitable predetermined lengths of frames, which are represented by "n (natural number)" channels or trucks each bearing "no." in FIG. 3b. Each frame starts with a sync code SYNC in the form of a fixed binary code such as "00011001", which indicates the beginning of the frame. The sync signal SYNC is followed by a data word Dij which represents data contained in the analog signal of FIG. 3a. In the no. n channel, however, the data words Dij are replaced by parity codes Pj which serve as error correction codes, thereby effecting parity check in the vertical direction. In practice, each parity code Pj has such a logical value that the sum of logical "1" in the vertically aligned bits become an even number.

The data arrangement in each of the channels is terminated by a check code CRCC which is a first error detection code. The check code CRCC is adapted for CRC (cyclic redundancy check). The check code CRCC and parity code Pj detect an error in any data word Dij and then correct the error, as will be described in detail.

Figure 3C:
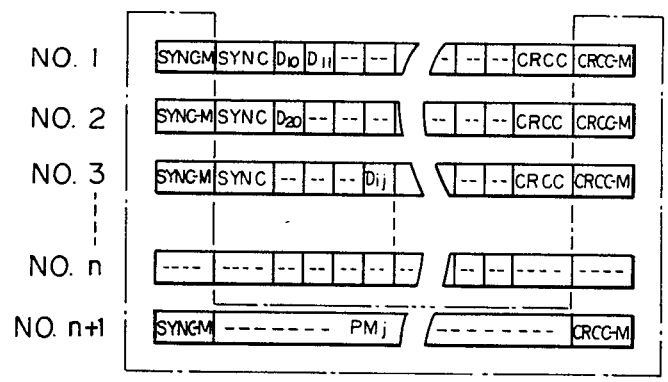
Figure 4:
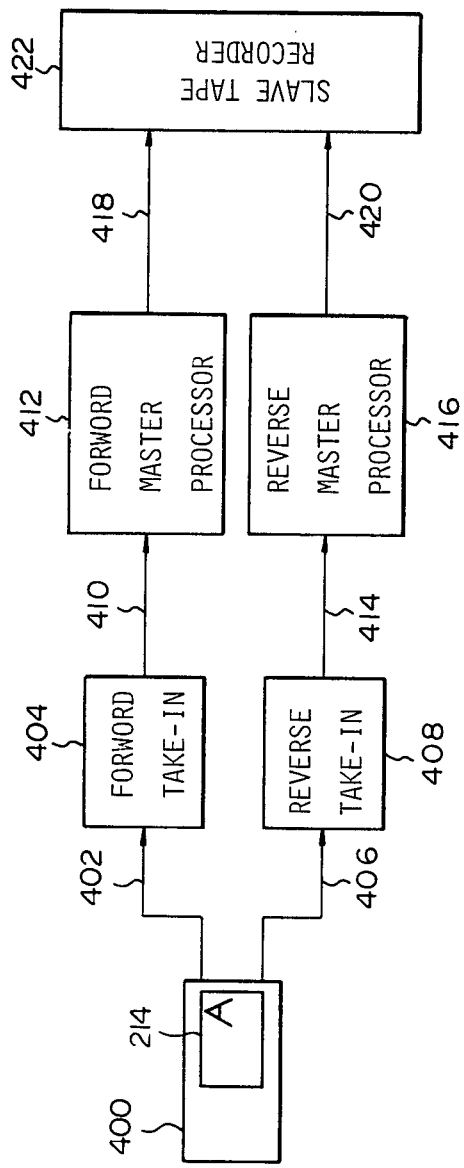
FIG. 4 is a block diagram showing a device for reproducing data from a master tape in accordance with the present invention.

The output of the PCM processor 202 having the above arrangement is coupled to a copy master processor 206 via a line 208. The copy master processor 206 adds a master sync signal SYNC-M and a master check code CRCC-M to all the signals shown in FIG. 3b channel by channel. Further, the copy master processor 206 adds a channel no. n+1 to the entire signals. This channel no. n+1 has master parity codes PMj in addition to the master sync signal SYNC-M and master check code CRCC-M. These additional signals are indicated by a phantom line in FIG. 3c. The master sync signal SYNC-M has a data arrangement such as "00101011" which is different from the sync code SYNC. The master sync code SYNC-M, master check code CRCC-M and master parity code PMj are common in function to the sync code SYNC, check code CRCC and parity code Pj. It should be noted that the additional signal format shown in FIG. 3c is not restrictive but only illustrative.

The output of the copy master processor 206 is fed to a copy master recording machine 210 via a line 212. A tape cassette 214 is loaded in the machine 210 to record on the A side of its master tape a necessary number of the data Dij in the frames, as shown in FIG. 3c. After the recording on the A side, the tape cassette 214 is turned over as indicated by arrows F1–F4 to record data on the B side of the master tape this time. Thus, the master tape stores data in its 2(n+1) channels in total along the directions shown in FIGS. 1a–1c.

Figure 5A:
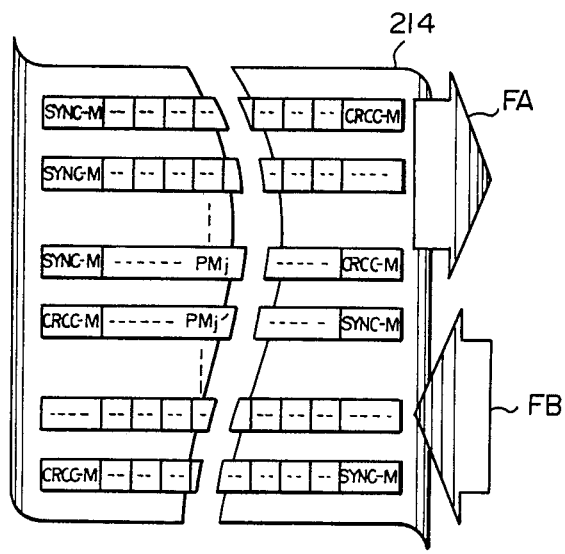
FIGS. 5a-5e are diagrams showing signals which appear in various sections of the device shown in FIG. 4.
Figure 5B:
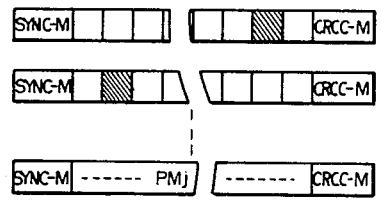
Figure 5C:
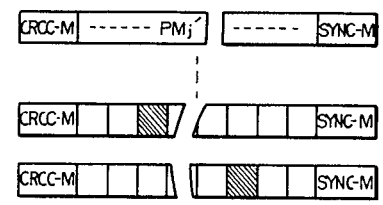

Referring to FIGS. 4 and 5a–5c, a device for reproducing the data stored in the master tape and recording them on a slave tape will be briefly described. The tape cassette 214 recorded with the data in opposite directions is loaded in a copy master reproducing machine 400. The machine 400 is connected by a line 402 to a forward take-in circuit 404 and by a line 406 to a reverse take-in circuit 408. As shown in FIG. 5a, the master tape in the tape cassette 214 has stored data in a direction FA on its A side and in a direction FB on its B side. The forward take-in circuit 404 takes in the data which has been recorded in the same direction as the reproducing direction, e.g. data on the A side shown in FIG. 5b. The reverse take-in circuit 408 takes in the data which has been recorded in the opposite direction to the reproducing direction, e.g. data on the B side shown in FIG. 5c. Each of the circuits 404 and 408 detects an error due to dropout or like cause as indicated by hatching in FIGS. 5b and 5c, using the master parity codes PMj and master check codes CRCC-M. The reverse take-in circuit 408 uses a reciprocal polynomial because the data take-in direction is opposite to the data recording direction.

Figure 5D:
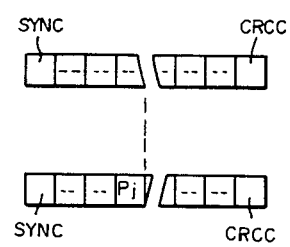
Figure 5E:
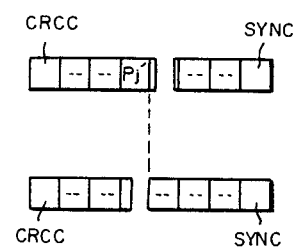

The forward take-in circuit 404 is connected by a line 410 to a forward master reproduction processor 412. Likewise, the reverse take-in circuit 408 is connected by a line 414 to a reverse master reproduction processor 416. The master reproduction processors 412 and 416 are connected by lines 418 and 420 to a slave tape recording machine 422, respectively. Each of the processors 412 and 416 corrects the detected error and supplies the slave tape recording machine 422 with its output which is shown in FIG. 5d or 5e. A slave tape loaded in the machine 422 is simultaneously recorded with the data shown in FIG. 5d on its A side and the data shown in FIG. 5e on its B side. Here, because the master sync codes SYNC-M, master parity codes PMj (PMj') and master check codes CRCC-M are unnecessary data which served for the data readout from the master tape and error detection and correction, they are not introduced into the slave tape in the machine 422. The data shown in FIGS. 5d and 5e coincide with the data shown in FIG. 3b with a very high probability. The sync codes SYNC, parity codes Pj (Pj') and check codes CRCC included in the data of FIGS. 5d and 5e are used for the data read-out and error detection and correction during reproduction from the slave tape. That is, the parity codes Pj (Pj') are employed to eliminate undesirable reproduction which may result from dropout or the like due to scratches on the slave tape, for example.

Details of the construction and operation of the various sections will be described hereunder.

Figure 6:
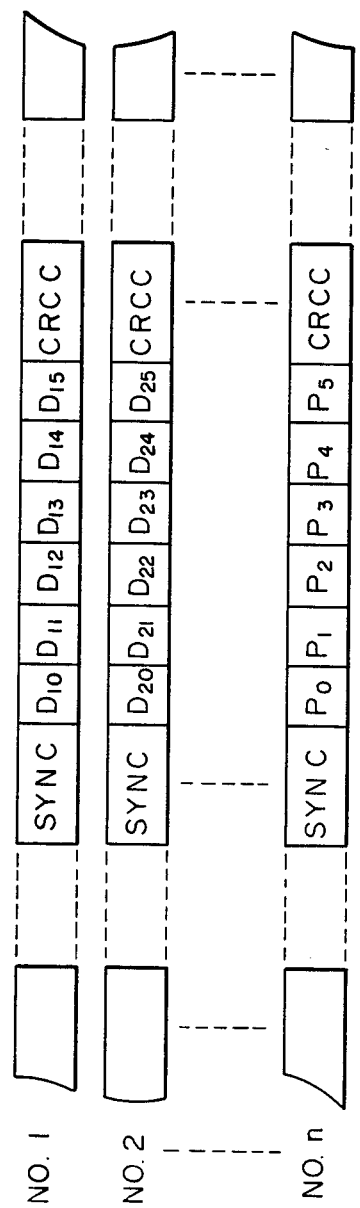
FIG. 6 is a view of an exemplary data arrangement which will be exchanged between tapes.

The PCM processor 202 allows the music or like analog signal for pulse code modulation and divides it into the channels nos. 1 to (n−1), as shown in FIGS. 2 and 3a and 3b. Parity codes are added to the data words Dij using the channel no. n, while sync codes SYNC and check codes CRCC are added to the channels nos. 1 to n. FIG. 6 shows an exemplary case in which six data words Dij are arranged in each channel. Such data is finally recorded on a slave tape. The sync code SYNC is adapted for the synchronization of each frame during reproduction. The check code CRCC and parity code Pj (Pj') are adapted to eliminate defective reproduction as might result from dropout due to damage on the slave tape, that is, to detect and correct errors during reproduction of the data words Dij. These signals are used in the course of data reproduction from a slave tape and not directly relevant to the present invention. For this reason, the output of the PCM processor 204 will be represented by data dij hereunder as shown in FIG. 7.

The use of "n" channels for recording data in a slave tape is due mainly to the relation of the data transfer rate to the reproduction speed of tapes. A usual apparatus for reproduction has a magnetic head in a predetermined position and its gap width cannot be reduced beyond a certain limit due to limitations in production. Meanwhile, a reproduction time of usually one hour or so is desired in recording or reproducing stereophonic programs. This, coupled with the fact that the length of a slave tape is limited due to the usual form of a tape cassette in the market, requires the tape to be fed quite slowly (e.g. 7.1 cm/sec) during reproduction. Considering such an arrangement and other factors of the magnetic head and the tape feed speed, "n" channels are used for recording data to achieve the necessary data transfer rate although the tape feed may be slowed down.

Figure 8:
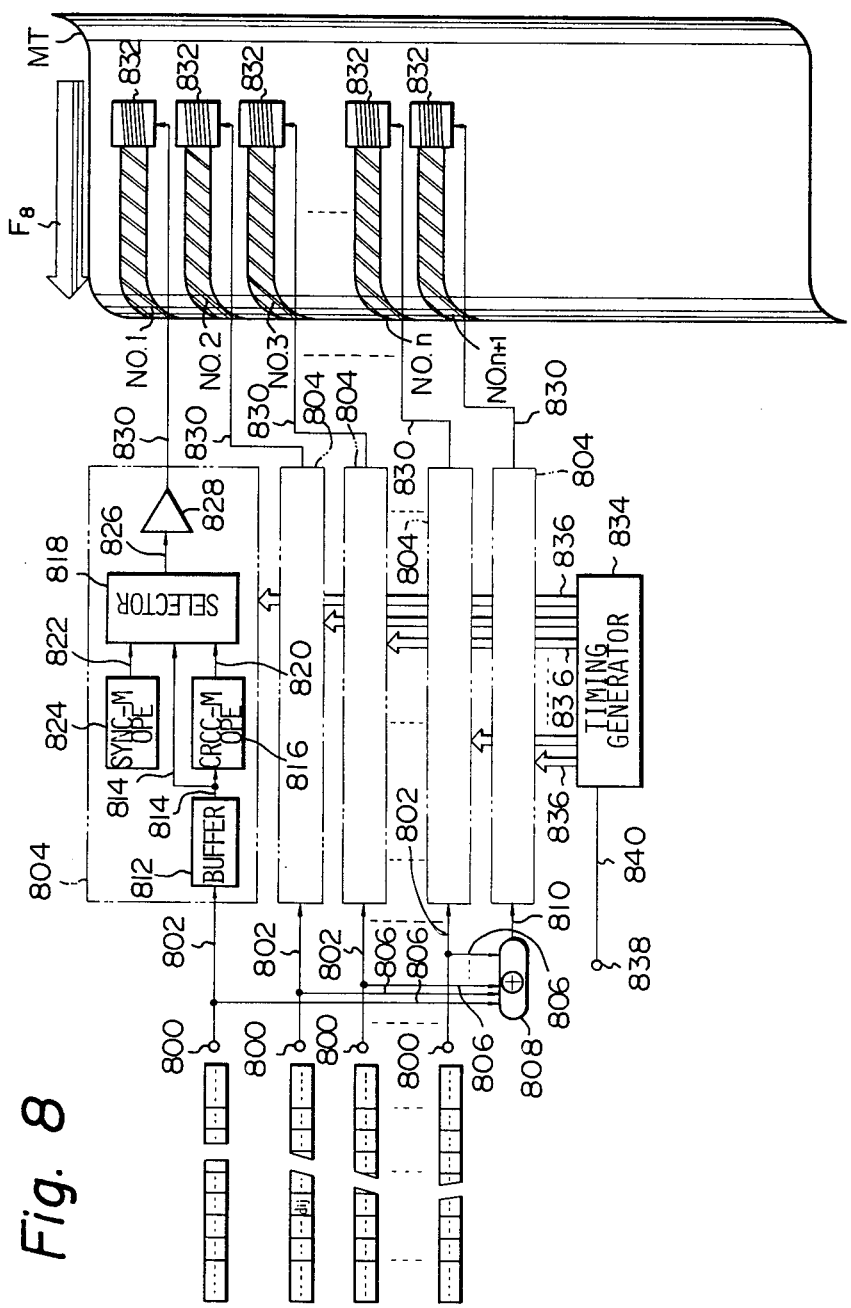
FIG. 8 is a block diagram showing details of a copy master processor.

Referring to FIG. 8, the copy master processor 206 has input terminals 800 which correspond in number to the channels n. Each input terminal 800 is connected by a line 802 to a copy master unit 804 and by a line 806 to an operation unit 808, which is connected to the copy master units 804 by lines 810. Each copy master unit 804 includes a buffer memory 812 which is connected to the line 802 or 810. The buffer memory 812 is connected by a line 814 to a CRCC-M operation section 816 and by the line 814 to a selector 818. The CRCC-M operation section 816 is connected by a line 820 to the selector 818. A SYNC-M generator section 824 is connected to the selector 818 by a line 822. The selector 818 is connected via a line 826 to an amplifier 828 which is in turn connected via a line 830 to a recording head 832. The number of the copy master units 804 is "n+1" which corresponds to the channels nos. 1 to (n+1). Having the same construction, the copy master units 804 are supplied with predetermined timing pulses from a timing generator section 834 via lines 836, such as clock pulses for the CRCC-M operator 816, timing signals for writing data in or reading data from the buffer memory 812 and timing signals for switching the selector 818. The timing generator 834 is connected to a terminal 838 by a line 840 to be supplied with master clock pulses from the outside which function as reference pulses for the operation. It should be noted in FIG. 8 that the master tape MT is fed in a direction indicated by an arrow F8.

Figure 7:
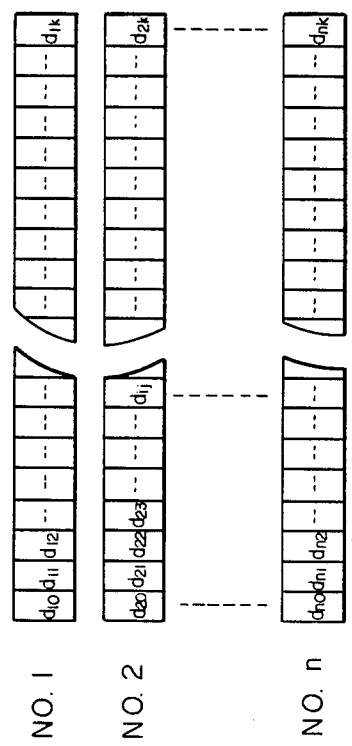
FIG. 7 is a view of a more generalized version of the data format shown in FIG. 6.

In operation, the various data dij shown in FIG. 7 corresponding to the different channels are respectively coupled to the input terminals 800 and therefrom to the associated copy master units 804 to be stored in the buffer memories 812. The SYNC-M generator 824 generates master sync signal codes SYNC-M at a suitable timing and feeds them to the selector 818. The selector 818 first delivers a master sync signal code SYNC-M and then the data dij which is read from the buffer memory 812. The data read from the buffer memory 812 is also fed to the CRCC-M operator 816 which then calculates and delivers a master check code CRCC-M. The selector 818 delivers the master check code CRCC-M after the data dij. One master frame of data thus appearing at the output of the selector 818 is shown in FIG. 9. The output data of the selector 818 is amplified by an amplifier 828 and then coupled to the associated recording head 832 to be recorded in the master tape MT.

Figure 10A:
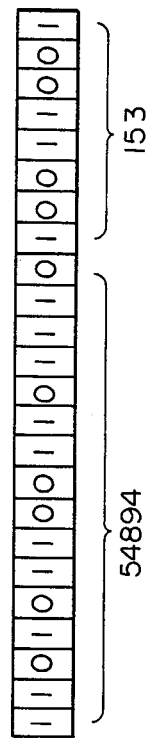
FIGS. 10a and 10b are diagrams demonstrating a manner of error detection with master check codes.

Computation at the CRCC-M operator 816 will be described. In response to the data dij, the CRCC-M operator 816 computes a master check code CRCC-M which is the residue remaining after dividing the data dij by a predetermined generator polynomial G(X). Suppose that the data dij is binary "11010110011011110" as shown in FIG. 10a.

Meanwhile, the data dij is also fed to the operation unit 808 which performs an operation:

$$PMj = d1j \oplus d2j \oplus \ldots \oplus dnj \qquad \text{Eq. (1)}$$

where j = 0, 1, ... k.

In the Eq. (1) shown above the sign $\oplus$ indicates modulo 2 addition. This operation is practiced on vertically aligned ones of the data dij, calculating a master parity code PMj. The master parity code PMj is fed to the copy master processor 206 and then delivered using the channel no. n+1 as shown in FIG. 9, while the master sync signal code SYNC-M and master check code CRCC-M are added to the master parity code PMj. The master parity code PMj is adapted for the well-known parity check and, therefore, will not be described for simplicity.

By the above procedure, the data shown in FIG. 9 are individually recorded on the A side of the master tape MT which is moving in the direction F8 in FIG. 8. In the same way, data are recorded on the B side after the recording on the A side.

While in the embodiment described one frame of data output from the PCM processor 202 has correspondence with one master frame of data to be recorded in the master tape, such is not essential and the data dij contained in one master frame may have any desired length.

A device for reproducing data from the A and B sides of the master tape MT is constructed and operated as follows.

Figure 11B:
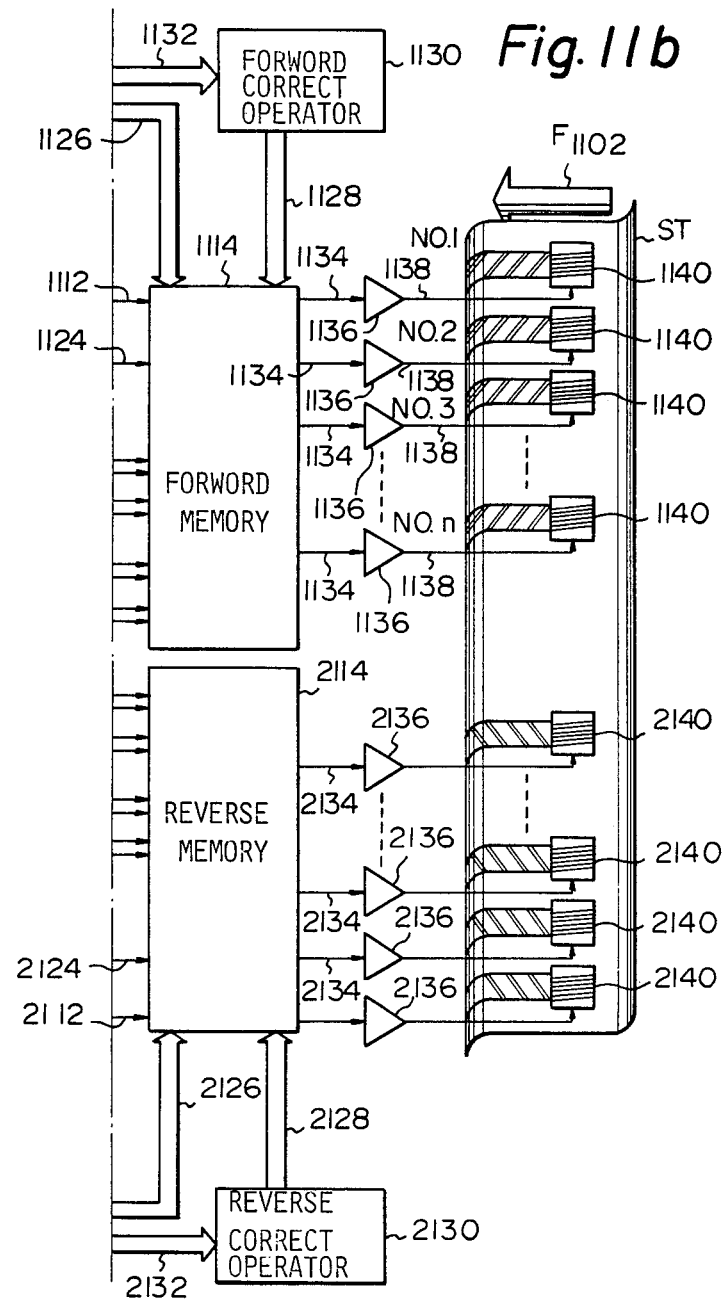

Referring to FIG. 11, the reproducing device includes magnetic heads 1100 for reproduction which are equal in number to the channels defined on the A and B sides of the master tape MT. In detail, the A side of the master tape MT carries data in its "n+1" channels from no. 1 to no. n+1 and, likewise, the B side carries data in its "n+1" channels from no. 1 to no. n+1. Hence, the number of the magnetic heads 1100 is 2(n+1) which corresponds to the total 2(n+1) channels on the master tape MT. The data are reproduced simultaneously from the A and B sides by the magnetic heads 1100.

First, the section for reproducing data from the A side of the master tape MT will be described. The magnetic heads 1100 associated with the respective channels on the A side are respectively connected by lines 1102 to forward take-in circuits 1104. All the circuits 1104 for the channels nos. 1 to (n+1) on the A side are constructed in the same way as each other. Each line 1102 connects to an equalizer 1106 which equalizes the input waveform. The equalizer 1106 connects via a line 1108 to a pulse detector 1110 which detects a pulse, that is, determines whether the input signal is logical "1" or logical "0". The pulse detector 1110 connects via a line 1112 to a forward memory 1114 and to a SYNC-M detector 1116 and a CRCC-M checker 1118. The SYNC-M detector 1116 detects a master sync signal code SYNC-M, while the CRCC-M checker 1118 checks an error by channel in response to the master check code CRCC-M. The SYNC-M detector 1116 connects via a line 1120 to a timing generator 1122 and the CRCC-M checker 1118 connects via a line 1124 to the forward memory 1114. The timing generator 1122 connects via a line 1126 to the forward memory 1114, while a forward correction operator circuit 1130 connects via a line 1128 to the forward memory 1114. The timing generator 1122 and forward correction operator circuit 1130 are interconnected by a line 1132. The timing generator 1122 supplies the forward memory 1114 with a control signal for access and the forward correction operator 1130 with a control signal for operation control. These control signals appear timed to a master sync signal code SYNC-M. In detail, when the timing generator 1122 is informed of the detection of a master sync signal code SYNC-M at the SYNC-M detector 1116, it feeds the control signals to the forward memory 1114 and forward correction operator 1130. Timed to these control signals, the forward memory 1114 writes or reads data and the forward correction operator 1130 performs a predetermined computation.

The forward memory 1114 is connected to amplifiers 1136 by lines 1134, respectively. Each amplifier 1136 is connected by a line 1138 to a recording magnetic head 1140. A slave tape ST is recorded with data using "n" channels from no. 1 to no. n on its A side (see FIGS. 5d and 5e) and, hence, the number of the magnetic heads 1140 is "2n" in total. The amplifiers 1136 are respectively associated with the magnetic heads 1140.

In operation, the master tape MT is fed in a direction indicated by an arrow F1100 and a slave tape ST in a direction indicated by an arrow F1102. The magnetic heads 1100 read the data from their associated channels nos. 1 to (n+1) on the A side of the master tape MT. The resulting signals are equalized by the respective equalizers 1106 and the corresponding pulse detectors 1110 detect pulses to determine the data in terms of logical levels. If without any error, the determined data will appear as illustrated in FIG. 9. Of these data, each master sync signal code SNYC-M is detected by the SYNC-M detector 1116. The data is stored in the forward memory 1114 in response to a control signal which is output from the timing generator 1122 timed to the detection of the master sync code SYNC-M.

Figure 10B:
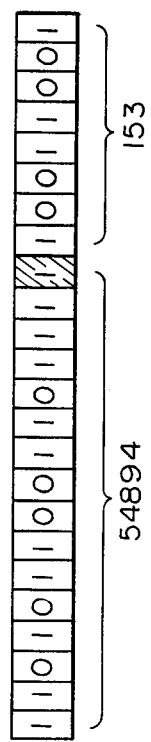

In the meantime, the CRCC-M checker 1118 determines whether or not the data in its associated channel involves an error. The master check code CRCC-M is determined as has been stated with reference to FIG. 10a, for example. Suppose that the data determined by the pulse detector 1110 is error-free and the data shown in FIG. 10a has been reproduced from the master tape MT. The CRCC-M checker 1118 regards the whole data dij and master check code CRCC-M as a single number. This value is divided by the generator polynomial G(X) and, if no residue results, the data is determined to be error-free. If with any residue, the data is judged erroneous and an error flag is fed to the forward memory 1114. Supposing that the data shown in FIG. 10a has been read as indicated in FIG. 10b from the master tape MT, then the error exists in the hatched portion of the data shown in FIG. 10b and, accordingly, the CRCC-M checker 1118 associated with the channel in question delivers an error flag. It will be noted that the operation of the CRCC-M checker 1118 described so far is performed channel by channel. Stated another way, the checker 1118 does not check which one of the data in the corresponding channel is erroneous but merely determines which one of the channels involves an error.

The forward correction operator 1130 is allocated to correct erroneous one of the data dij. Of the reproduced data shown in FIG. 9, the channel with an error is designated by an error flag which is output from the associated CRCC-M checker 1118. This error flag is also coupled to the forward correction operator 1130. The forward memory 1114 supplies the forward correction operator 1130 with the master parity codes PMj which are stored in the channel no. n+1 of the master tape MT. The operator 1130 carries out vertical partity check referring to the master parity codes PMj, thereby locating erroneous data in the vertical or up-and-down direction as seen in FIG. 9. In this manner, an error is checked horizontally based on the master check codes CRCC-M and vertically based on the master parity codes PMj. Inasmuch as digital signals are either logical "0" level or logical "1" level, the error can be corrected merely by changing the logical level of the erroneous data dij to "1" if it is "0" or vice versa. When the data dik is erroneous, for example, a correct value of this data is obtained by an operation:

$$dik = d2k \oplus d3k \oplus \ldots \oplus dnk \oplus PMk \quad \text{Eq. (2)}$$

The forward correction operator 1130 performs the above computation to correct any error in the data dij which are stored in the forward memory 1114. Thereafter, the forward memory 1114 delivers data dij for each of the channels nos. 1 to n. The output data does not include the master sync signal codes SYNC-M, master check codes CRCC-M or the master parity codes PMj which performed their duties in reading data from the master tape MT and detecting and correcting data error in a known manner. The output data from the forward memory 1114 are in the format shown in FIG. 6. The data is amplified by the amplifiers 1136, fed to the associated magnetic heads 1140 and thereby recorded in the slave tape ST. In detail, the PCM processor 202 shown in FIG. 2 subjects the data to pulse code modulation, divides them into a plurality of channels, and adds to them the data of the redundancy bits for synchronization and error detection and correction, which are shown in FIG. 3b. These data shown in FIG. 3b are recorded on the slave tape ST through the master tape MT.

During data reproduction from the master tape MT, the master tape MT is fed at a rate which is, for example, 16–32 times the feed rate at the time of recording data on the master tape MT. The slave tape ST is fed at the same rate as the master tape MT during reproduction.

Now, the other section of the device for reproducing data from the B side of the master tape MT will be described, except for the portions common to the A side reproducing section described above. In FIG. 11, the magnetic heads 1100 allocated to the respective channels on the B side of the master tape MT are respectively connected by lines 2102 to reverse take-in circuits 2104, which are common in construction. The line 2102 is connected to an equalizer 2106 which is in turn connected to a pulse detector 2110 by a line 2108. The pulse detector 2110 is connected by a line 2112 to a reverse memory 2114 as well as to a SYNC-M detector 2116 and a CRCC-M checker 2118. The data stored in the master tape MT is read out in the opposite direction to the recording direction. Therefore, the CRCC-M checker 2118 uses, instead of the generator polynomial G(X), a reciprocal polynomial $\overline{G}(X)$ which is expressed as:

$$\overline{G}(X) = X^m \cdot G\left(\frac{1}{X}\right) \quad \text{Eq. (3)}$$

where m is the polynomial G(X).

If the creative polynomial is, for example, $$G(X) = X^{16} + X^{12} + X^5 + 1 \quad \text{Eq. (4)}$$

then the reciprocal polynomial $\overline{G}(X)$ is $$\overline{G} = X^{16}\left\{\left(\frac{1}{X}\right)^{16} + \left(\frac{1}{X}\right)^{12} + \left(\frac{1}{X}\right)^5 + 1\right\} \quad \text{Eq. (5)}$$

-continued
$$= X^{16} + X^{11} + X^4 + 1$$

Employing such a reciprocal polynomial $\overline{G}(X)$, the CRCC-M checker 2118 determines whether any one of the channels involves an error. The vertical parity check occurs in the previously described manner.

The SYNC-M detector 2116 is connected by a line 2120 to a timing generator 2122. The CRCC-M checker 2118 is connected by a line 2124 to a reverse memory 2114. The timing generator 2122 is connected by a line 2126 to the reverse memory 2114. A reverse correction operator 2130 is connected by a line 2128 to the reverse memory 2114. Further, the timing generator 2122 and reverse correction operator 2130 are interconnected by a line 2132. The reverse memory 2114 is connected by lines 2134 to amplifiers 2136 which are respectively connected by lines 2138 to their associated magnetic heads 2140. The slave tape ST is recorded with data in the "n" channels from no. 1 to no. n on the B side, as has been the case with the A side.

In principle, the operation of the section for reproducing data from the B side of the master tape MT is the same as that of the other section allocated to the A side. The difference is that, as to the B side, the reciprocal polynomial $\overline{G}(X)$ is used during error detection based on the master check codes CRCC-M, due to the reading sequence opposite to the recording sequence. The data read from the master tape MT in the opposite sequence to the recording operation is recorded in the slave tape ST according to the reading order after the error detection and correction.

As described above, the reproducing apparatus reads out data simultaneously from the A and B sides of the master tape MT and records them in the slave tape ST at the same time, while correcting any error due to the dropout or the like of the master tape MT in a known manner. To replace the reciprocal polynomial $\overline{G}(X)$ with the usual creative polynomial G(X), the data reproducing section allocated to the master tape B side may be constructed such that one master frame of data is once accumulated in a suitable memory and the error is checked by reading them out in the same sequence as in the recording operation.

Figure 12:
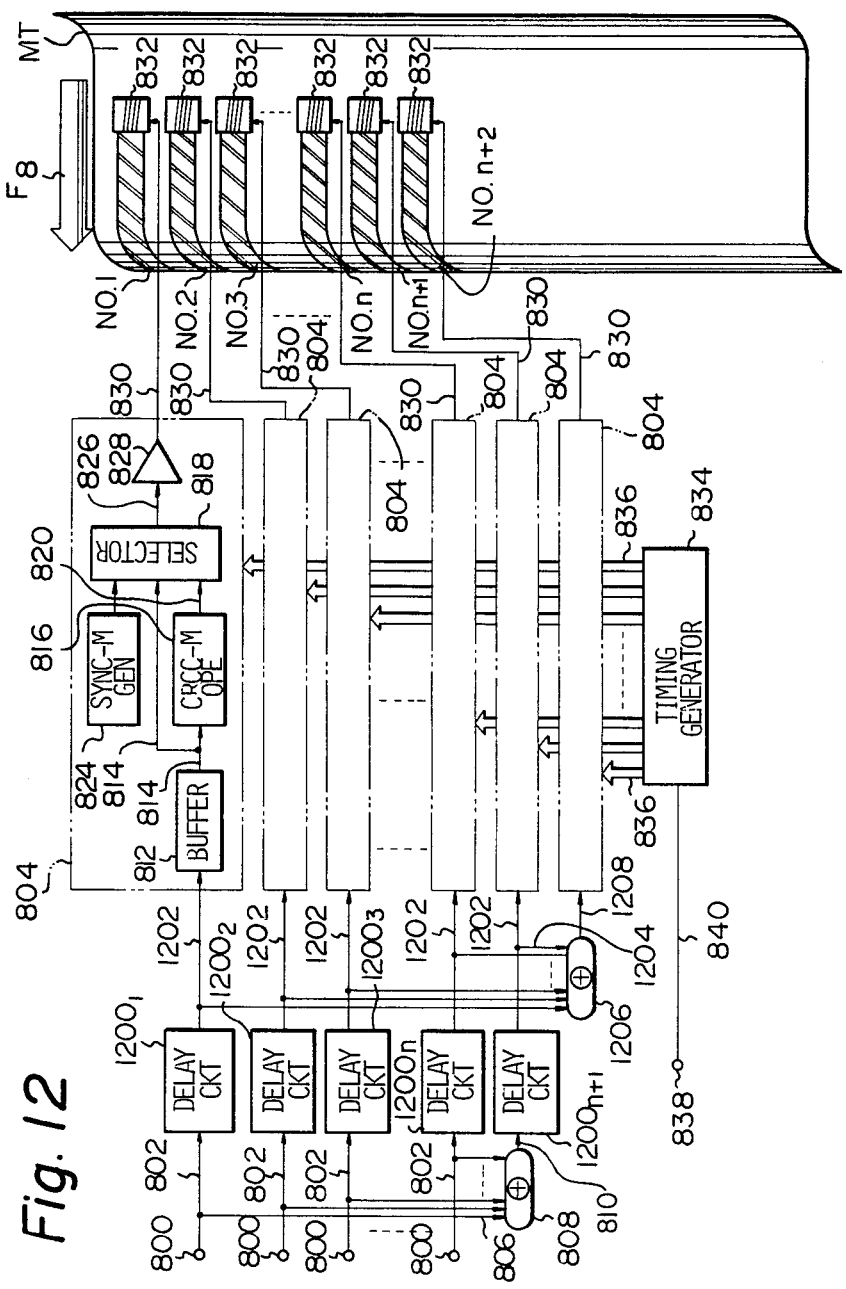
FIG. 12 is a block diagram of another example of the copy master processor.
Figure 13:
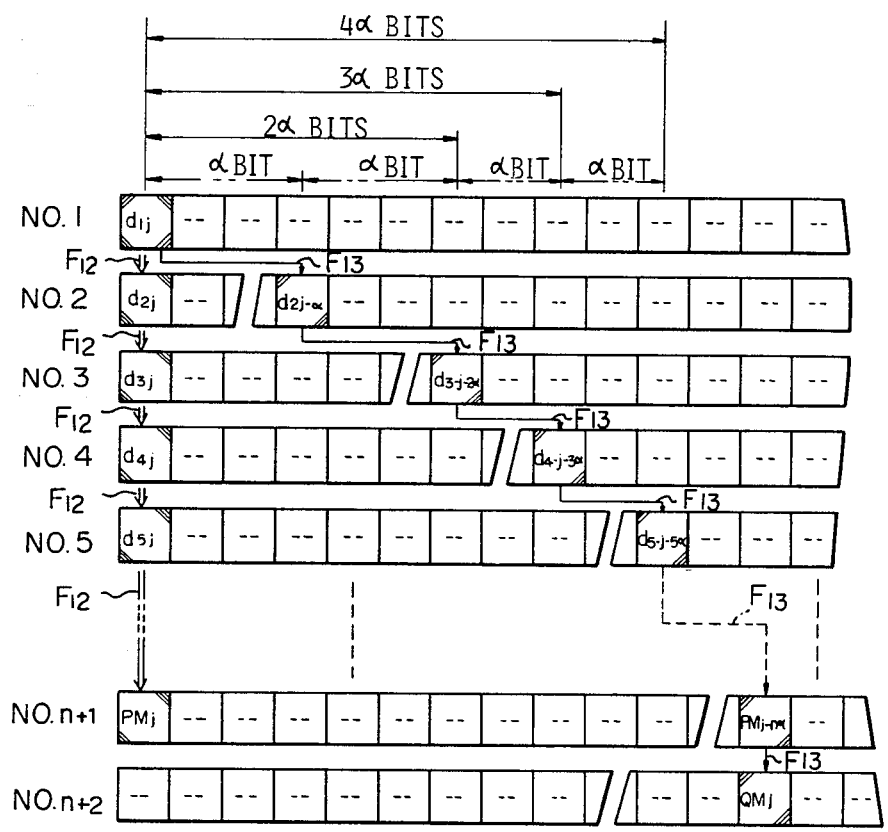
FIG. 13 is a diagram illustrative of a manner of interlacing or interleaving.

Referring to FIGS. 12 and 13, another embodiment of the present invention is shown which is elaborated to more effectively suppress the influence of dropout and other undesired occurrence. This embodiment employs interlace or interleave for the data dij and adds other error correction codes to the data dij. Particularly, the illustrated embodiment is successful in scattering data errors in continuous burst and thereby effectively detecting data errors.

Referring to FIG. 12, an example of a copy master processor for applying interlace is shown. In FIG. 12, the structural elements common to those shown in FIG. 8 are designated by the same reference numerals and will not be described. The interlace is performed by delay circuits 1200₁–1200ₙ₊₁. The delay circuits 1200₁–1200ₙ are respectively connected by the lines 802 to the input terminals 800, while the delay circuit 1200ₙ₊₁ is connected by the line 810 to the operation unit 808. All the delay circuits 1200₁–1200ₙ₊₁ are respectively connected by lines 1202 to the copy master units 804 and by lines 1204 to a second operation unit 1206, which is in turn connected by a line 1208 to the "n+2" copy master unit 804. The operation unit 808 delivers master parity codes PMj which have been described previously in connection with the first embodiment. For example, the data dij shown in FIG. 13 is calculated as indicated by arrows F12 according to an equation:

$$PMj = d1i \oplus d2j \oplus \ldots \oplus dnj.$$

In operation, the delay circuit $1200_1$ delays input data by unit delay $\alpha$ bits multiplied by 0, that is, it passes the input data to the operation unit 1206 without any delay. Let us observe the specific data d1j for convenience. The delay circuit $1200_2$ delays the input data by $\alpha$ bits multiplied by 1. Thus, as shown in FIG. 13, while the channel no. 1 is supplying the operation unit 1206 with the data d1j, the channel no. 2 supplies it with the data $d2 \cdot j - \alpha$. The delay circuit $1200_3$ delays the input data by $\alpha$ bits multiplied by 2 so that the channel no. 3 feeds data $d3 \cdot j - 2\alpha$ to the operation unit 1206 while the channel no. 1 is feeding data d1j thereto. The same applies to the other channels. The operation unit 1206, in this manner, calculates a second master parity code QMj for the data indicated by arrows F13 in FIG. 13:

$$QMj = d1j \oplus d2 \cdot j - \alpha \oplus d3 \cdot j - 2\alpha \oplus \ldots \oplus dn \cdot j - (n-1)\alpha \oplus PMj - n\alpha$$

where $j = 0, 1, 2, 3, \ldots, k$ and $\oplus$ is the modulo 2 addition.

Using the second master parity code QMj, which is an error correction code, together with the first master parity code further enhances the data error correcting ability of the apparatus. While the interlace length has been shown and described as being $\alpha$ bits, it may be suitably determined to meet a desired application.

Figure 14:
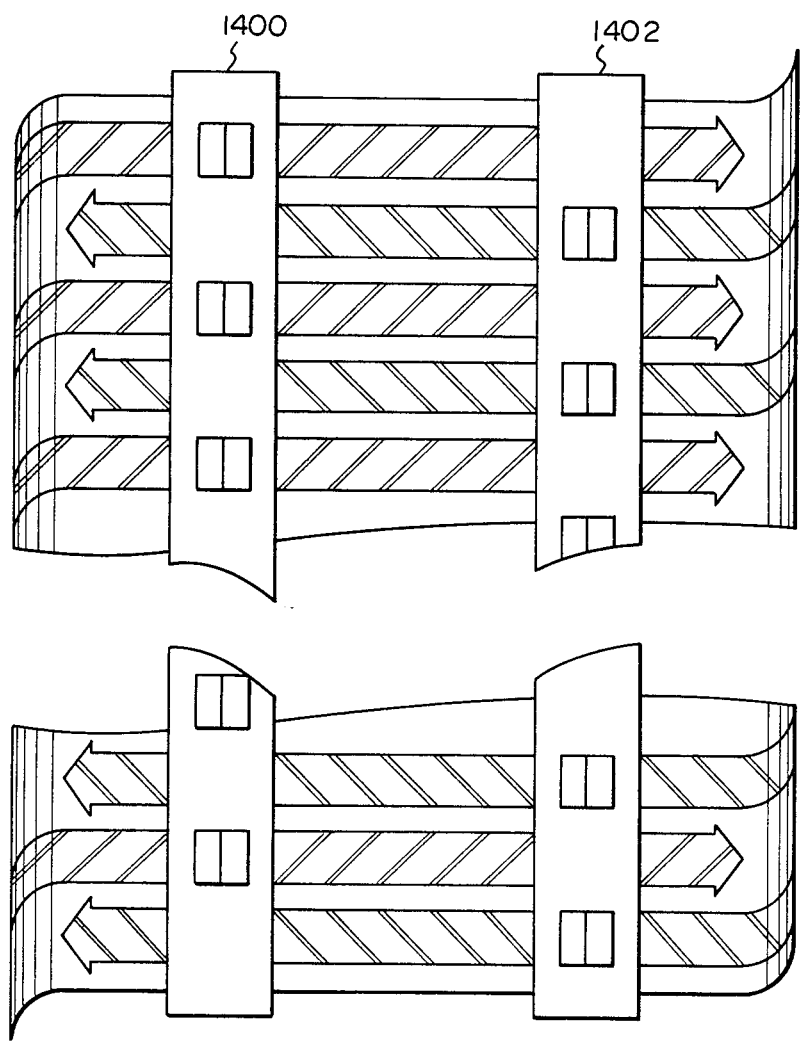
FIG. 14 is a view of a magnetic tape showing another possible arrangement of channels.

In any one of the foregoing embodiments, upper and lower halves of a tape have been assigned to the data on the A side and B side or vice versa. To prevent crosstalk, data may be recorded alternately in a plurality of channels on the A and B sides. As shown in FIG. 14, for example, magnetic heads 1400 for a forward run and magnetic heads 1402 for a reverse run may be positioned in staggered arrangement along the direction of movement of the tape, so that the forward channels and reverse channels alternate each other.

In summary, it will be seen that the present invention provides a data recording and reproducing apparatus which detects and corrects any error with a sufficient probability which may result from dropout or the like during reproduction of data from a master recording medium, regardless of the primary data reproduction system which is either forward or reverse with respect to time. Additionally, the apparatus records a plurality of different series of primary data simultaneously in a slave recording medium with no regard to the recording order of the primary data, thereby saving time and labor required for the recording operation.

Various modifications will become possible for those skilled in the art after receiving the teachings of the present disclosure without departing from the scope thereof. For example, the magnetic tape employed as a recording medium in the embodiments shown and described may be replaced by a magnetic disc, magnetic drum, semiconductor memory or any other recording medium without effecting the principle of the present invention.

What is claimed is:

1. A digital data duplication apparatus for reproducing digital primary data stored in a master recording medium and recording the reproduced primary data in a slave recording medium, comprising:

a data recording device for recording the digital primary data on the master recording medium, said recording device comprising formatting means for formatting the primary data when the primary data is to be recorded on the master recording medium, adding means for adding secondary check data including at least a master parity code to the primary data employing each fragment of the primary data as a unit, and first recording means for recording said primary and secondary check data on the master recording medium in opposite directions comprising a forward direction and a reverse direction; and a data reproducing device for reproducing at the same time both the primary data and secondary check data recorded on the master recording medium in both the forward and reverse directions, said reproducing device comprising forward data take-in means for taking in the primary and secondary check data recorded in the forward direction to detect an error in said take-in primary data using a generator polynomial, reverse data take-in means for taking in the primary and secondary check data recorded in the reverse direction to detect an error in said take-in primary data using a reciprocal polynomial, forward master reproduction processing means connected to the forward data take-in means for correcting said detected error, reverse master reproduction processing means connected to the reverse data take-in means for correcting said detected error, and second recording means connected to both the forward and reverse master reproduction processing means for recording at the same time on the slave recording medium the corrected primary data recorded in both the forward and reverse directions.

2. An apparatus as claimed in claim 1, in which the master recording medium comprises a master tape and the slave recording medium comprises a slave tape.

3. An apparatus as claimed in claim 2, in which the secondary check data further includes a master sync signal code and a master check code.

4. An apparatus as claimed in claim 3, in which two sets of the master parity codes are added to the primary data which belongs to one master frame.

5. An apparatus as claimed in claim 1, in which the primary data is recorded on the slave recording medium at a speed which is higher than a speed at which the primary data is recorded on the master recording medium.

* * * * *